(12) United States Patent
Nakayama et al.

(10) Patent No.: US 8,678,566 B2
(45) Date of Patent: Mar. 25, 2014

(54) PIEZOELECTRIC ELEMENT, METHOD FOR MANUFACTURING THE SAME, PIEZOELECTRIC ACTUATOR, LIQUID EJECTING HEAD, AND LIQUID EJECTING APPARATUS

(75) Inventors: Masao Nakayama, Shiojiri (JP); Hideki Hahiro, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 37 days.

(21) Appl. No.: 13/070,318

(22) Filed: Mar. 23, 2011

(65) Prior Publication Data

US 2011/0234708 A1    Sep. 29, 2011

(30) Foreign Application Priority Data

Mar. 26, 2010    (JP) .................................. 2010-073195

(51) Int. Cl.
*B41J 2/045*    (2006.01)

(52) U.S. Cl.
USPC .................................. 347/72; 347/71; 347/68

(58) Field of Classification Search
USPC .......................................... 347/72, 71, 70, 68
See application file for complete search history.

(56) References Cited

U.S. PATENT DOCUMENTS

| 6,336,717 | B1 * | 1/2002 | Shimada et al. ................ 347/71 |
| 7,997,695 | B2 | 8/2011 | Shimada |
| 2006/0213043 | A1 * | 9/2006 | Iwashita et al. .............. 29/25.35 |

FOREIGN PATENT DOCUMENTS

| JP | 2004-66600 | | 3/2004 | |
| JP | 2006-269958 | | 10/2006 | |
| JP | 2008-205268 | * | 9/2008 | ............ H01L 21/822 |
| JP | 2009-206329 | * | 9/2009 | ............. H01L 41/09 |
| JP | 2009-234022 | | 10/2009 | |

* cited by examiner

*Primary Examiner* — Henok Legesse
(74) *Attorney, Agent, or Firm* — Workman Nydegger

(57) ABSTRACT

A piezoelectric element includes a first electrode, a second electrode, and a piezoelectric layer between the first electrode and the second electrode. The first electrode includes a first electroconductive layer having a first surface at the piezoelectric layer side and a second electroconductive layer having a second surface at the first surface side. The second electroconductive layer mainly contains lanthanum nickelate and is disposed on the first surface. The first electrode, the piezoelectric layer and the second electrode overlap with each other when viewed in the direction of the normal to the first surface to form an overlap portion acting as a driving portion. At least part of the second electroconductive layer is disposed within the sides of the first surface within the driving portion, and the second surface has a smaller area than the first surface within the driving portion.

11 Claims, 11 Drawing Sheets

PIEZOELECTRIC ELEMENT, METHOD FOR MANUFACTURING THE SAME, PIEZOELECTRIC ACTUATOR, LIQUID EJECTING HEAD, AND LIQUID EJECTING APPARATUS

This application claims a priority to Japanese Patent Application No. 2010-073195 filed on Mar. 26, 2010 which is hereby expressly incorporated by reference herein in its entirety.

BACKGROUND

1. Technical Field

The present invention relates to a piezoelectric element and a method for manufacturing the same, and to a piezoelectric actuator, a liquid ejecting head and a liquid ejecting apparatus.

2. Related Art

It is known that piezoelectric elements are used in liquid ejecting heads of liquid ejecting apparatuses, such as ink jet printers used for, for example, image recording apparatuses and display manufacturing apparatuses, and in various types of piezoelectric actuator.

A piezoelectric element may be manufactured by, for example, forming a piezoelectric layer on a lower electrode, and covering the piezoelectric layer with an upper electrode.

For example, in JP-A-2006-269958, it is disclosed that the piezoelectricity of the piezoelectric layer is enhanced by forming the electroconductive uppermost layer of the lower electrode, which comes into contact with the piezoelectric layer, of a material containing lanthanum nickelate so as to control the orientation of the piezoelectric layer.

However, when such a piezoelectric element is operated, stress is liable to concentrate at the edge of the lower electrode. In addition, while the piezoelectricity of the piezoelectric layer on the lanthanum nickelate layer is enhanced, lanthanum nickelate is diffused into the piezoelectric layer to reduce the withstand voltage.

Consequently, the piezoelectric layer of the piezoelectric element may be broken, for example, with a crack or burnout in a vicinity of the ends of the lower electrode. Accordingly, it is desirable to provide a piezoelectric element that is not easily broken physically and is thus highly reliable.

SUMMARY

An advantage of some aspects of the invention is that it provides a highly reliable piezoelectric element and its manufacturing method, and a piezoelectric actuator, a liquid ejecting head and a liquid ejecting apparatus that include the piezoelectric element.

According to an embodiment of the invention, a piezoelectric element is provided which includes a first electrode, a second electrode, and a piezoelectric layer between the first electrode and the second electrode. The first electrode includes a first electroconductive layer having a first surface at the piezoelectric layer side and a second electroconductive layer having a second surface at the first surface side. The second electroconductive layer mainly contains lanthanum nickelate and is disposed on the first surface. The first electrode, the piezoelectric layer and the second electrode overlap with each other when viewed in the direction of the normal to the first surface to form an overlap portion acting as a driving portion. At least part of the second electroconductive layer is disposed within the sides of the first surface within the driving portion, and the second surface has a smaller area than the first surface within the driving portion.

In the piezoelectric element, at least part of the second electroconductive layer lies within the sides of the first surface within the driving portion. The second surface of the second electroconductive layer mainly containing lanthanum nickelate has a smaller area than the first surface within the driving portion. Consequently, at least part of the portion of the piezoelectric layer lying between the second electroconductive layer and the second electrode can be disposed within the driving portion. In addition, the piezoelectric layer has at the boundary of the driving portion a portion having a higher withstand voltage than the portion between the second electroconductive layer and the second electrode. Furthermore, in the piezoelectric layer, the displacement of the portion at the boundary of the driving portion can be smaller than that of the portion between the second electroconductive layer and the second electrode. Accordingly, stress to the piezoelectric layer can be reduced at the boundary of the driving portion defined by the ends of the first electroconductive layer, and the withstand voltage at the boundary can be increased. Thus, the reliability of the piezoelectric element can be enhanced.

The piezoelectric layer may have a first portion lying between the second electroconductive layer and the second electrode and a second portion other than the first portion, and the first portion is more highly oriented in the (100) direction than the second portion.

The piezoelectric layer may have a cavity therein over the first surface in a region adjacent to an end of the second electroconductive layer.

The cavity can absorb stress placed on the ends of the first electroconductive layer, which are liable to undergo stress concentration. Thus, the reliability of the piezoelectric element can be further enhanced.

The first electroconductive layer may have a third surface opposite the first surface and a fourth surface connecting between the first surface and the third surface, and the third surface and the fourth surface may form an angle of 50° or less.

Thus, the angle of the corner defined by the third surface and the fourth surface can be increased to alleviate the concentration of an electric field at the boundary of the driving portion. Thus, the piezoelectric element can be more reliable.

According to another embodiment of the invention, a piezoelectric actuator is provided which includes a vibration plate and the above-described piezoelectric element disposed on the vibration plate.

Since the piezoelectric element is reliable, the piezoelectric actuator can also be reliable.

In another embodiment of the invention, a piezoelectric actuator including a vibration plate and a plurality of above-described piezoelectric elements are provided. The piezoelectric elements are arranged on the vibration plate in a first direction. In the piezoelectric actuator, the first electrode extends in the first direction so as to function as a common electrode of the plurality of piezoelectric elements. The piezoelectric layer of each piezoelectric element extends in a second direction intersecting the first direction on the first electrode, and the second electrode extends in the second direction on the piezoelectric layer and overlies at least part of the first electrode. The second electroconductive layer of each piezoelectric element has ends in the second direction at least one of which lies within the sides of the first surface within the driving portion.

Since the piezoelectric element is reliable, the piezoelectric actuator can also be reliable.

In this piezoelectric actuator, the second electroconductive layer may have ends in the first direction at least one of which lies on the first surface within the boundary of the driving portion.

According to another embodiment of the invention, a piezoelectric actuator including a vibration plate and a plurality of above-described piezoelectric elements is provided. The piezoelectric elements are arranged on the vibration plate in a first direction. The first electrode of each piezoelectric element extends in a second direction intersecting the first direction, and the piezoelectric layer extends in the second direction and covers the first electrode. The second electrode overlies at least part of the first electrode and spreads so as to act as a common electrode of the plurality of piezoelectric elements. The second electroconductive layer of each piezoelectric element has ends in the second direction at least one of which lies within the sides of the first surface within the driving portion.

Since the piezoelectric element is reliable, the piezoelectric actuator can also be reliable.

In this piezoelectric actuator, the second electroconductive layer may have ends in the first direction at least one of which lies within the sides of the first surface within the driving portion.

According to another embodiment of the invention, a liquid ejecting head is provided which includes any one of the above-described piezoelectric actuators.

Since the piezoelectric element and the piezoelectric actuator are reliable, the liquid ejecting head can be reliable.

According to another embodiment of the invention, a liquid ejecting apparatus including the liquid ejecting head is provided.

The liquid ejecting apparatus can include a liquid ejecting head including a reliable piezoelectric element.

According to another embodiment of the invention, a method for manufacturing a piezoelectric element is provided. In the method, a first electroconductive film having a first surface is formed on a substrate in such a manner that the first surface lies opposite the substrate. A second electroconductive film having a second surface is formed of a material mainly containing lanthanum nickelate on the surface of the first electroconductive film in such a manner that the second surface lies at the first surface side. The first electroconductive film and the second electroconductive film are patterned to form a first electrode including a first electroconductive layer and a second electroconductive layer. A first piezoelectric material film is formed over the first electrode, and is crystallized by heat treatment. The crystallized first piezoelectric material film is patterned to form a first piezoelectric layer. A third electroconductive film is formed over the first piezoelectric layer. The third electroconductive film is patterned to form a second electrode overlying at least part of the first electrode with the first piezoelectric layer therebetween. The first electrode, the piezoelectric layer and the second electrode overlap with each other when viewed in the direction of the normal to the first surface to form an overlap portion acting as a driving portion. The second electroconductive layer is disposed within the sides of the first surface within the driving portion, and the second surface has a smaller area than the first surface within the driving portion.

The method can manufacture a reliable piezoelectric element.

The method may further include forming a second piezoelectric layer over the second electroconductive film by forming a second piezoelectric material film, heat-treating the second piezoelectric material film, and patterning the second piezoelectric film. The patterning of the first electroconductive film and the second electroconductive film includes forming a region not having the second electroconductive layer between the first electroconductive layer and the second piezoelectric layer in a region adjacent to an end of the second electroconductive layer over the first surface by side-etching part of the second electroconductive film covered with the second piezoelectric layer. The region not having the second electroconductive layer forms a cavity by the forming and crystallizing of the first piezoelectric material film.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described with reference to the drawings. However, the invention is not limited to the following embodiments. Various modifications may be made without departing from the scope and spirit of the invention, and the invention includes various combinations of the embodiments and modifications.

1. Piezoelectric Element and Piezoelectric Actuator

1.1 First Embodiment

A piezoelectric element 100 according to a first embodiment will now be described with reference to the corresponding drawings.

Figure 1A:
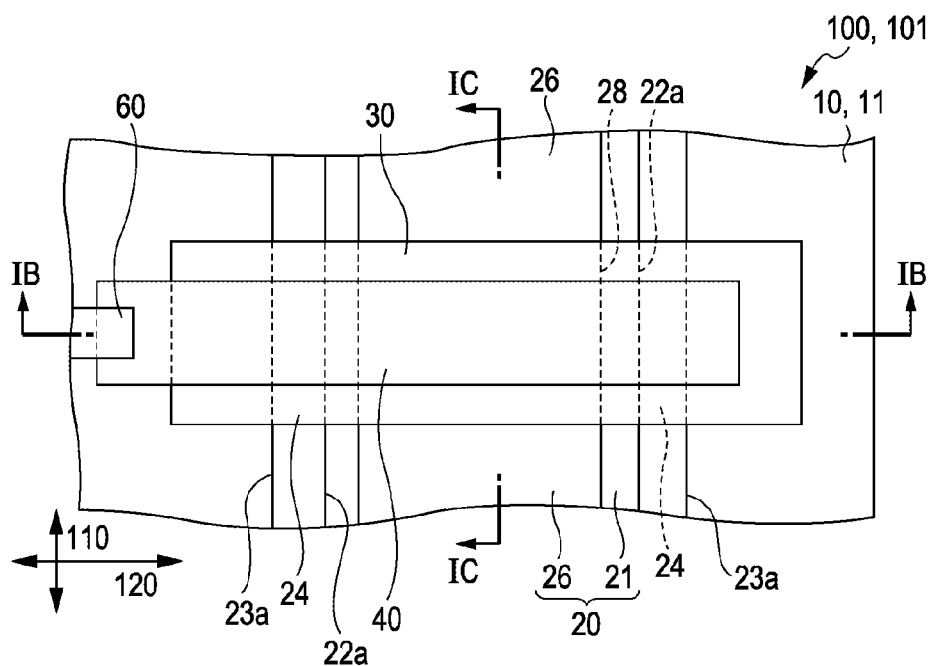
FIG. 1A is a schematic plan view of a piezoelectric element according to an embodiment of the invention.
Figure 1B:
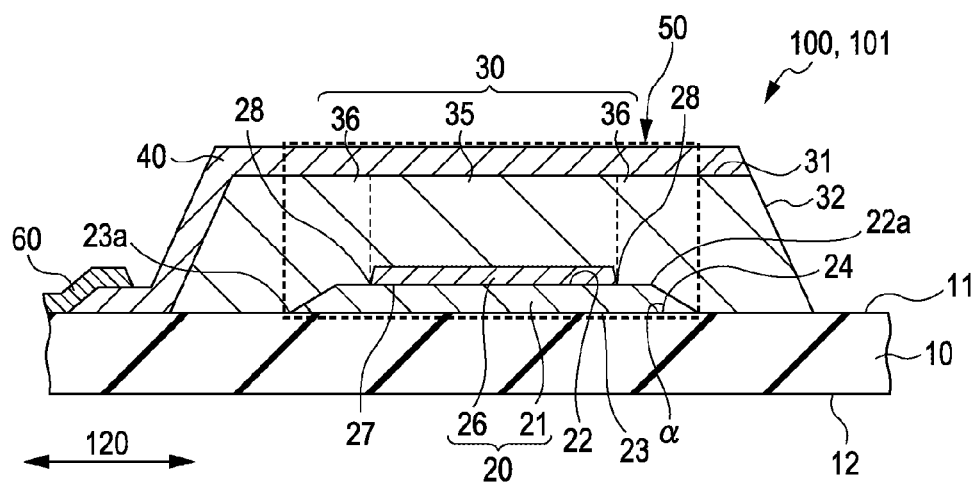
FIG. 1B is a schematic sectional view of the piezoelectric element taken along line IB-IB in FIG. 1A.
Figure 1C:
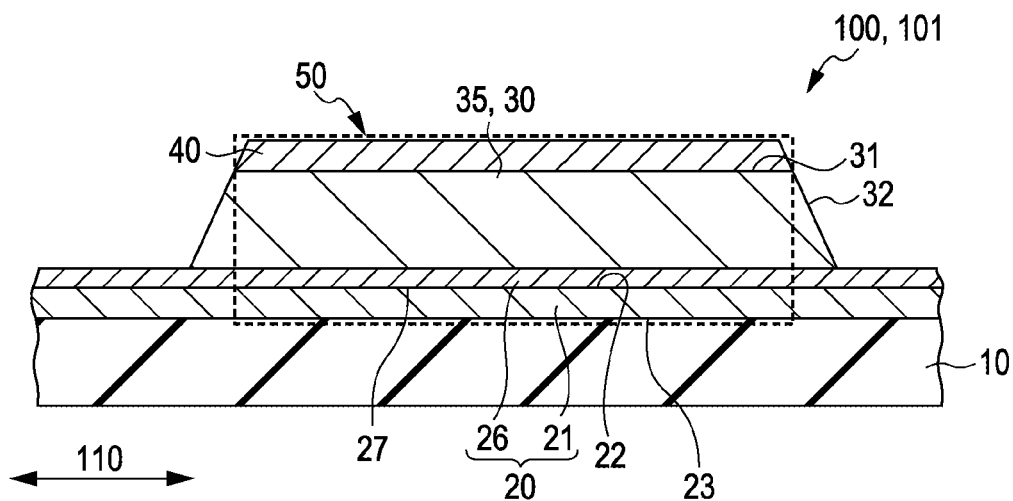
FIG. 1C is a schematic sectional view of the piezoelectric element taken along line IC-IC in FIG. 1.
Figure 1D:
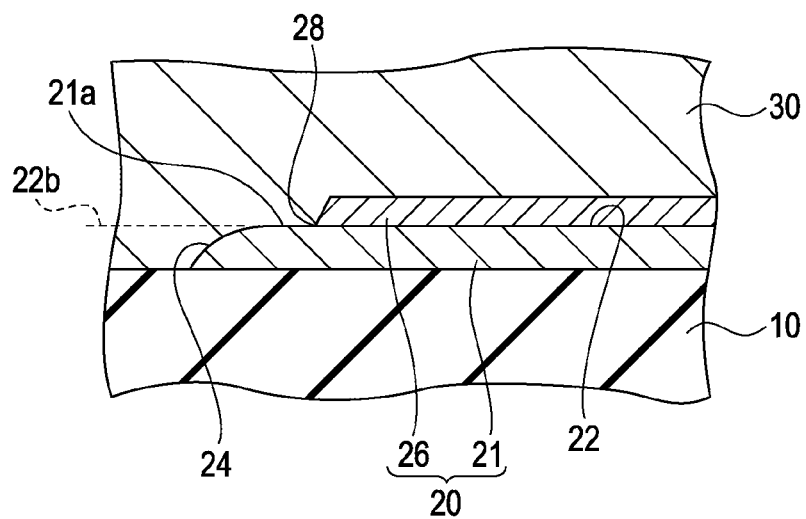
FIG. 1D is a schematic enlarged sectional view of an end of a piezoelectric element according to an embodiment of the invention.

FIG. 1A is a schematic plan view of the piezoelectric element 100 according to the first embodiment. FIGS. 1B and 1C are schematic sectional views of the piezoelectric element 100 of the first embodiment. FIG. 1B shows the section taken along line IB-IB in FIG. 1A, and FIG. 1C shows the section taken along line IC-IC in FIG. 1A. FIG. 1D schematically shows an end of a first electrode 20.

The piezoelectric element 100 includes a first electrode 20, a second electrode 40, and a piezoelectric layer 30 disposed between the first and second electrodes 20 and 40. The first electrode 20 includes a first electroconductive layer 21 having a first surface 22 at the piezoelectric layer 30 side, and a second electroconductive layer 26 formed on the first surface 22 of the first electroconductive layer 21 and having a second surface 27 at the first surface 22 side.

A substrate 10 on which the piezoelectric element 100 is formed may be a vibration plate. In this instance, the piezoelectric element 100 can be a piezoelectric actuator 101. The details of the piezoelectric actuator 101 will be described later.

As shown in FIG. 1B, the first electrode 20, the piezoelectric layer 30 and the second electrode 40 overlap with each other when viewed in the direction of the normal to the first surface 22, and the overlap portion (portion indicated by a bold dashed line shown in FIG. 1B) is defined as a driving portion 50.

As shown in FIG. 1A, the piezoelectric layer 30 and the second electrode 40 extend is a second direction 120, and the second direction 120 intersects with a first direction 110. The first direction 110 may be perpendicular to the second direction 120. A plurality of piezoelectric elements 100, not shown in the figures, may be arranged in the first direction 110.

As shown in FIGS. 1A to 1C, the piezoelectric element 100 may be supported on a substrate 10. The substrate 10 may be a vibration plate described later. In this instance, the structure including the substrate 10 and the piezoelectric element 100 may be a piezoelectric actuator 101.

The substrate 10 is a plate member and has an upper surface 11 on which the piezoelectric element 100 is disposed and a lower surface 12 opposite the upper surface 11, as shown in FIG. 1A. The shape of the substrate 10 is not particularly limited in plan view when viewed in the direction of the normal to the upper surface 11. The substrate 10 supports the piezoelectric element 100 at the upper surface 11.

The substrate 10 may be made of, for example, an electrical conductor, a semiconductor, or an insulating material. Since the first electrode 20 is formed on the upper surface 11 of the substrate 10, at least the upper surface 11 can be made of an insulating material. For example, a single-crystal silicon substrate can be used as the substrate 10. The substrate 10 may include a lead wire (not shown) electrically connected to the first electrode 20.

The substrate 10 may be a flexible vibration plate that can be deformed (bent) by the behavior of the piezoelectric layer 30. If the substrate 10 is a vibration plate, the shape of the vibration plate 10 can be designed according to the shape of the piezoelectric actuator. The structure and material of the vibration plate 10 are not particularly limited as long as the vibration plate 10 is elastic and flexible. For example, the vibration plate 10 may be a multilayer composite including a plurality of layers (not shown). For example, the vibration plate 10 may be a composite including a silicon dioxide ($SiO_2$) layer and a zirconium dioxide ($ZrO_2$) layer, or another composite including a metal layer, such as a nickel layer, or a polymeric material layer, such as a polyimide layer.

The first electrode 20 is formed on the upper surface 11 of the substrate 10, as shown in FIGS. 1A and 1B. The first electrode 20 is one of the electrodes applying a voltage to the piezoelectric layer 30. As shown in FIG. 1A, the first electrode 20 may extend in the first direction 110 so as to act as a common electrode of a plurality of piezoelectric elements 100. Hence, the first electrode 20 may function as the first electrodes of other piezoelectric elements 50 not shown in the figures. The first electrode 20 includes a first electroconductive layer 21 having a first surface 22 at the piezoelectric layer 30 side and a third surface 23 opposite the first surface 22, and a second electroconductive layer 26 formed on the first surface 22 and having a second surface 27 at the first surface 22 side, as shown in FIG. 1B.

The first electroconductive layer 21 is an electroconductive plate member disposed on the upper surface 11 of the substrate 10, as shown in FIG. 1A. The first electroconductive layer 21 may have a fourth surface 24 connecting between the first surface 22 to the third surface 23, as shown in FIG. 1B.

The first electroconductive layer 21 may have first corners 22a defined by the first surface 22 and the fourth surface 24 and second corners 23a defined by the third surface 23 and the fourth surface 24. The second corners 23a may have an angle $\alpha$ of 50° or less. This feature of the second corner 23a can be applied to other embodiments in which the second corner 23a defines the boundary of the driving portion 50, without being limited to the present embodiment.

As shown in FIG. 1A, the first corners 22a can be sides of the first surface and the second corners 23a can be sides of the third surface 23, when viewed from the normal to the first surface 22. The sides of a surface mentioned herein refer to the edges of a structure when viewed in the direction of the thickness of the structure. For example, the sides of the surface of Structure A refer to the edges of Structure A when viewed from the thickness direction.

The sides 23a being the edge of the first electroconductive layer 21 may define the boundary of the driving portion 50, as shown in FIG. 1B. In this instance, the sides 22a in the second direction 120 of the first surface 22 of the first electroconductive layer 21 lie within the driving portion 50, as shown in FIG. 1B.

Since the first electrode 20 may act as a common electrode of a plurality of piezoelectric elements 100, as described above, the first electroconductive layer 21 may extend in the first direction 110, as shown in FIG. 1C.

The fourth surface 24 may be curved as shown in FIG. 1D. The fourth surface 24 may be, for example, a convex, as shown in FIG. 1D. In this instance, the first surface 22 and the fourth surface 24 do not form a clear corner 22a. When the fourth surface 24 is curved, the first corner (sides of the first surface) 22a may be defined by the intersection of an imaginary plane 22b flush with the first surface 22 and the curved fourth surface 24, as shown in FIG. 1D.

The structure and material of the first electroconductive layer 21 are not particularly limited unless it is made of lanthanum nickelate ($LaNO_3$, hereinafter may be represented by LNO). For example, the first electroconductive layer 21 may be composed of a single layer. Alternatively, it may be a composite of a plurality of electroconductive layers. The first electroconductive layer 21 may contain platinum (Pt), iridium (Ir) or one of their conductive oxides, or gold (Au).

The first electroconductive layer 21 may be connected to a lead portion (not shown). The lead portion may be connected to a driving voltage-generating circuit (not shown) or a ground circuit (not shown).

The second electroconductive layer 26 is a conductive plate member disposed on the first surface 22 of the first electroconductive layer 21 within the driving portion 50, as shown in FIGS. 1A and 1B. The second electroconductive layer 26 has the second surface 27 at the first surface 22 side, as shown in FIG. 1B. Also, the second electroconductive layer 26 has ends 28 in the second direction 120. When the second surface 27 is viewed in the direction of the normal, the ends 28 of the second electroconductive layer 26 are sides of the second surface 27, as shown in FIG. 1A. As shown in FIGS. 1A and 1B, at least part of the ends 28 lie within the sides 22a of the first surface 22 within the driving portion 50. Accordingly, the second surface 27 has a smaller area than the first surface 22 within the driving portion 50.

Since the first electrode 20 may act as a common electrode of a plurality of piezoelectric elements 100, as described above, the second electroconductive layer 26 may extend in the first direction 110, like the first electroconductive layer 21, as shown in FIG. 1C.

The structure and material of the second electroconductive layer 26 are not particularly limited as long as it is electrically conductive and is made of lanthanum nickelate ($LaNO_3$, represented by LNO). The second electroconductive layer 26 mainly containing lanthanum nickelate is preferably controlled to a desired orientation direction of the piezoelectric layer 30 described below. For example, the second electroconductive layer 26 may be oriented in the (100) direction.

The piezoelectric layer 30 is formed so as to cover the first electrode 20 including the first and second electroconductive layers 21 and 26 in the driving portion 50, as shown in FIGS. 1A and 1B. The shape of the piezoelectric layer 30 is not particularly limited as long as it covers the first electrode 20 in the driving portion 50. The piezoelectric layer 30 may extend in the second direction 120, as shown in FIG. 1A. Also, the piezoelectric layer 30 may have an upper surface 31 and tapered side surfaces 32 connecting the upper surface 31 thereof to the upper surface 11 of the substrate 10, as shown in FIG. 1B. The piezoelectric layer 30 is made of a polycrystal having piezoelectricity, and can be deformed by an applied voltage. The piezoelectric layer 30 can be made of any piezoelectric material and can have any structure without particular limitation, as long as it is piezoelectric. The piezoelectric layer 30 can be made of a known piezoelectric material, such as a perovskite oxide. Examples of the piezoelectric material of the piezoelectric layer 30 include lead zirconate titanate ($Pb(Zr, Ti)O_3$), lead zirconate titanate niobate ($Pb(Zr, Ti, Nb)O_3$), bismuth sodium titanate ($(Bi, Na)TiO_3$), barium titanate ($BaTiO_3$), and potassium niobate ($KNbO_3$).

The piezoelectric layer 30 includes a first portion 35 disposed between the second electroconductive layer 26 and the second electrode 40 and a second portion 36 other than the first portion 35, as shown in FIG. 1B. At least part of the first portion 35 lies within the sides 22a of the first surface 22 within the driving portion 50. In other words, at least part of the first portion 35 can be disposed within the region between the first surface 22 within the driving portion 50 and the second electrode 40.

If the second electroconductive layer 26 is oriented in the (100) direction, the first portion 35 overlying the second electroconductive layer 26 is more highly oriented in the (100) direction than the second portion 36. Thus, the first portion 35 can have higher piezoelectricity than the second portion 36. The lanthanum (La) and nickel (Ni) of the LNO in the second electroconductive layer 26 are diffused into the first portion 35 more than into the second portion 36. Thus, the first portion 35 can have a lower withstand voltage than the second portion 36. In other words, the second portion 36 has a higher withstand voltage than the first portion. This will be described in detail later.

The second electrode 40 is provided over the piezoelectric layer 30 so as to overlap with the first electrode 20 with the piezoelectric layer 30 therebetween when viewed in the direction of the normal to the first surface 22, as shown in FIGS. 1A and 1B. The second electrode 40 is the other of the electrodes applying a voltage to the piezoelectric layer 30. The second electrode 40 is not particularly limited in shape as long as it overlies the first electrode 20 in the driving portion 50. For example, the second electrode 40 may extend in the second direction 120 on the upper surface 31 of the piezoelectric layer 30, as shown in FIG. 1A.

The structure and material of the second electrode 40 are not particularly limited as long as the second electrode 40 is electrically conductive. For example, the second electrode 40 may be composed of a single layer. Alternatively, it may be a composite of a plurality of layers. The second electrode 40 may include a metal layer containing platinum (Pt), iridium (Ir) or one of their conductive oxides, or gold (Au). It may be made of the same material as the first electroconductive layer 21.

The second electrode 40 is electrically connected to a lead portion 60, as shown in FIGS. 1A and 1B. The lead portion 60 may be connected to a driving voltage-generating circuit (not shown) or a ground circuit (not shown).

In addition, a protective film (not shown) may be formed to protect the piezoelectric element from moisture or the like. The protective film can be provided to cover at least the piezoelectric layer 30. The protective film may be made of alumina or an organic material such as polyimide.

The piezoelectric element 100 and the piezoelectric actuator 101 of the present embodiment of the invention have the above-described structure.

The piezoelectric element 100 and the piezoelectric actuator 101 according to the present embodiment have the following features.

In the piezoelectric element 100, the second surface 27 of the second electroconductive layer 26 mainly containing LNO has a smaller area than the first surface 22 within the driving portion 50. The piezoelectric layer 30 includes the first portion 35 between the second electroconductive layer 26 and the second electrode 40. As described above, the first portion 35 has a lower withstand voltage than the second portion 36, which is the portion of the piezoelectric layer 30 other than the first portion 35. In the piezoelectric element 100 of the present embodiment, at least part of the first portion 35 is disposed inside the region between the first surface 22 within the driving portion 50 and the second electrode 40. Thus, for example, the second portion 36 lies at least part of the boundary of the driving portion 50 defined by edges 23a of the first electroconductive layer 21. Consequently, the stress concentration on the ends of the driving portion during operation of the piezoelectric layer 30 can be reduced and the withstand voltage can be increased. Accordingly, the reliability of the piezoelectric element 100 of the present embodiment can be enhanced. The piezoelectric actuator 101 of the present embodiment includes the piezoelectric element 100. Hence the piezoelectric actuator 101 can have the same features as the piezoelectric element 100.

1.2 Second Embodiment

A piezoelectric element 200 and a piezoelectric actuator 201 according to a second embodiment will now be described with reference to the corresponding drawings. The piezoelectric element 200 and the piezoelectric actuator 201 are different from those of the first embodiment in terms of the region where the second electroconductive layer 26 is disposed. The same parts as in the first embodiment are designated by the same reference numerals and the same description will not be repeated.

Figure 2A:
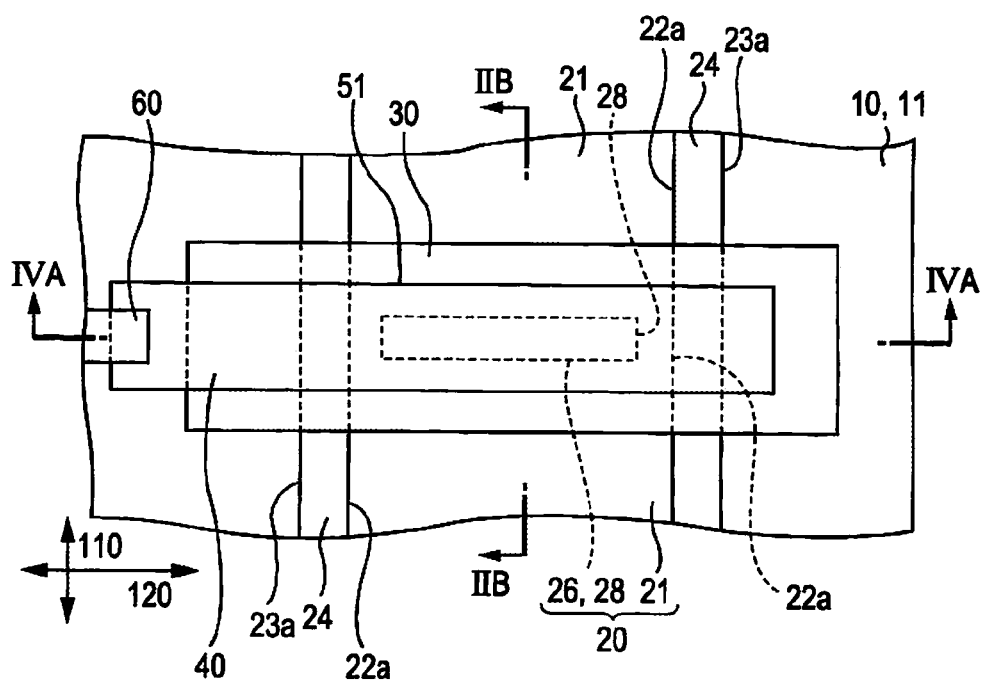
FIG. 2A is a schematic plan view of a piezoelectric element according to an embodiment of the invention.
Figure 2B:
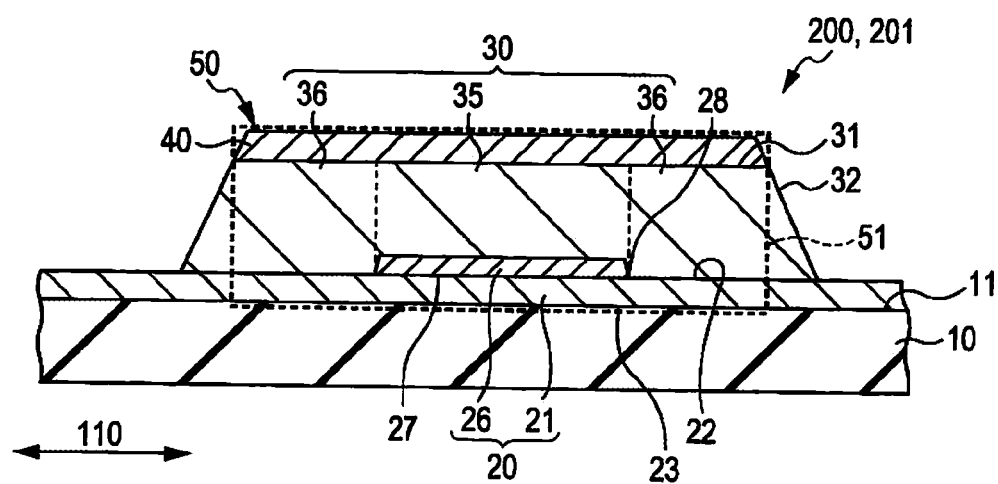
FIG. 2B is a schematic sectional view of the piezoelectric element taken along line IIB-IIB in FIG. 2A.

FIG. 2A is a schematic plan view of the piezoelectric element 200 according to the second embodiment. FIG. 2B is a schematic sectional view of the piezoelectric element 200 taken along line IIB-IIB in FIG. 2A.

As shown in FIGS. 2A and 2B, the second electroconductive layer 26 of the piezoelectric element 200 extends in the second direction 120 within the driving portion 50, but not extend in the first direction 110, unlike the piezoelectric element 100 of the first embodiment. Thus, at least one end 28 in the first direction 110 of the second electroconductive layer 26 lies on the first surface 22 within the boundary 51 of the driving portion 50, as shown in FIG. 2B.

In the present embodiment, since the first electroconductive layer 21 extends in the first direction 110, the boundary 51 of the driving portion 50 is defined by the edge of the second electrode 40, as shown in FIG. 2B.

In the piezoelectric element 200 of the present embodiment, at least one end 28 in the first direction 110 of the second electroconductive layer 26 is located on the first surface 22 within the boundary 51 of the driving portion 50. Thus, at least part of the boundary 51 of the driving portion 50 is occupied by the second portion 36 of the piezoelectric layer having a higher withstand voltage than the first portion 35, as in the first embodiment. Since the first portion 35 and the second portion 36 have been described above, the same description is not repeated.

According to the structure of the present embodiment, the reliability of the piezoelectric element 200 can be enhanced. The piezoelectric actuator 201 of the present embodiment includes the piezoelectric element 200. Hence the piezoelectric actuator 201 can have the same features as the piezoelectric element 200.

1.3 Third Embodiment

A piezoelectric element 300 and a piezoelectric actuator 301 according to a third embodiment will now be described with reference to the corresponding drawings. The piezoelectric element 300 and the piezoelectric actuator 301 are difference from those of the first embodiment in terms of the regions where the first electrode 20 and the second electrode 40 are disposed. The same parts as in the first embodiment are designated by the same reference numerals and the same description will not be repeated.

Figure 3A:
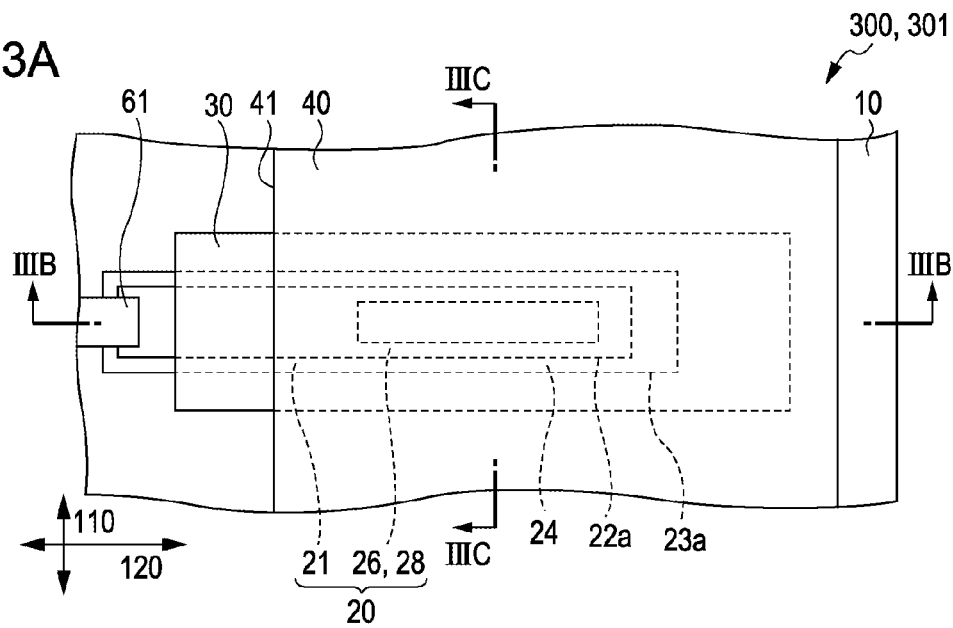
FIG. 3A is a schematic plan view of a piezoelectric element according to an embodiment of the invention.
Figure 3B:
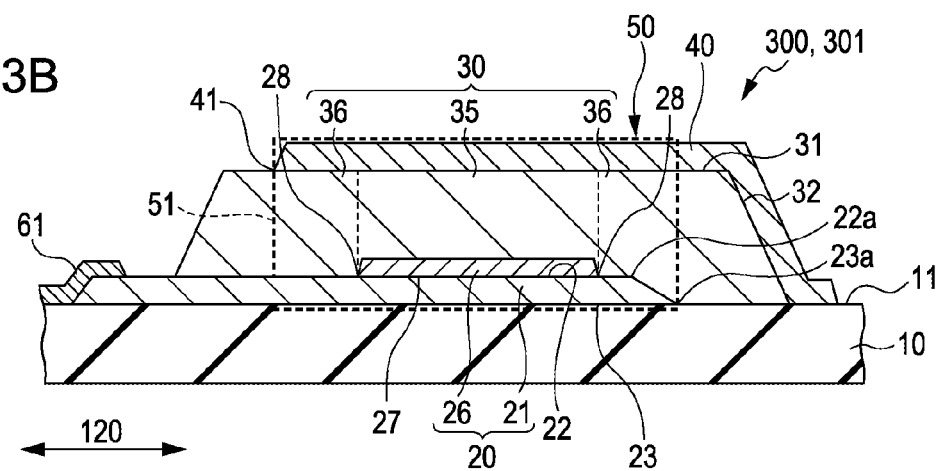
FIG. 3B is a schematic sectional view taken along line IIIB-IIIB in FIG. 3A.
Figure 3C:
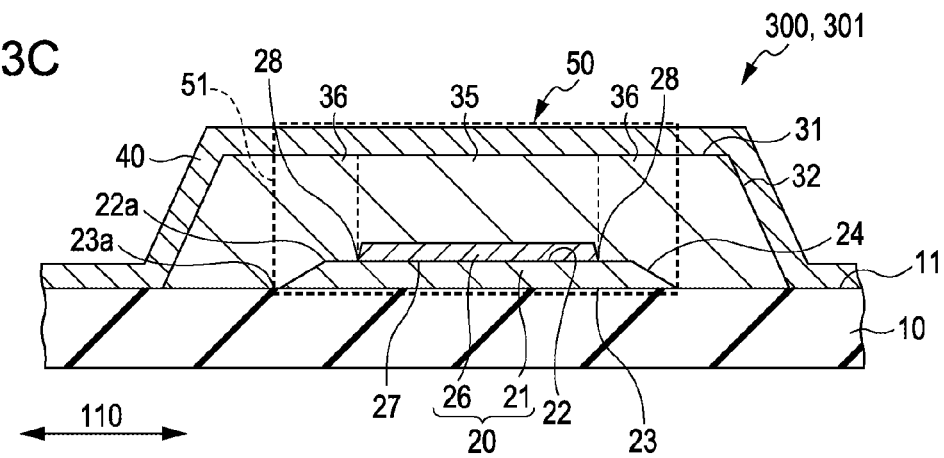
FIG. 3C is a schematic sectional view taken along line IIIC-IIIC in FIG. 3A.

FIG. 3A is a schematic plan view of the piezoelectric element 300 according to the third embodiment. FIG. 3B is a schematic sectional view of the piezoelectric element 300 according to the third embodiment. FIG. 3C is another schematic sectional view of the piezoelectric element 300. FIG. 3B shows a section taken along line IIIB-IIIB in FIG. 3A, and FIG. 3C shows a section taken along line IIIC-IIIC in FIG. 3A.

As shown in FIGS. 3A and 3B, the first electrode 20 of the piezoelectric element 300 of the present embodiment extends in the second direction 120. Hence, the first electroconductive layer 21 and the second electroconductive layer 26 extend in the second direction 120. The first electroconductive layer 21 and the second electroconductive layer 26 of the first electrode 20 are covered with the piezoelectric layer 30 in the first direction 110, as shown in FIGS. 3A and 3C. Also, the first electroconductive layer 21 has a portion not covered with the piezoelectric layer 30, and this portion may be electrically connected to the lead portion 61, as shown in FIGS. 3A and 3B. The lead portion 61 may be electrically connected to a driving circuit (not shown).

Both ends 28 in the first direction 110 of the second electroconductive layer 26 lie within the sides 22a of the first surface 22 within the driving portion 50, as shown in FIGS. 3A and 3C. One end 28 in the second direction 120 of the second electroconductive layer 26 lies within the sides 22a of the first surface 22 within the driving portion 50, and the other end 28 lies on the first surface 22 within the boundary 51 of the driving portion 50, as shown in FIGS. 3A and 3B.

The second electrode 40 extends in the first direction 110, as shown in FIGS. 3A and 3C, and may act as a common electrode of a plurality of piezoelectric elements 300. Hence, the second electrode 40 may function as the second electrodes of other piezoelectric elements 300 arranged in the first direction 110, but not shown in the figures. Thus, the second electrode 40 is formed so as to cover the upper surface 31 and the side surfaces 32 in the first direction 110 of the piezoelectric layer 30, as shown in FIG. 3C. Also, the second electrode 40 may cover one side surface 32 in the second direction 120 of the piezoelectric layer 40, as shown in FIG. 3B. Also, the second electrode 40 has an end 41 in the second direction 120 on the upper surface 31 of the piezoelectric layer 31, as shown in FIG. 3B.

In the present embodiment, the boundary 51 of the driving portion 50 of the piezoelectric element 300 may be defined by the end 41 of the second electrode 40 at one side and by the sides 23a of the third surface of the first electroconductive layer 21 at the other sides. For example, one side of the boundary 51 of the driving portion 50 in the second direction 120 is defined by the end 41 of the second electrode 40, and the other side is defined by the side 23a of the third surface 23 of the first electroconductive layer 21, as shown in FIG. 3B. In the first direction 110, both sides of the boundary 51 are defined by the sides 23a of the third surface 23 of the first electroconductive layer 21, as shown in FIG. 3C.

Thus, in the piezoelectric element 300 of the present embodiment, at least one end 28 in the second direction 120 of the second electroconductive layer 26 can be located within the sides 22a of the first surface 22 within the driving portion 50. Also, at least one end 28 in the second direction 120 of the second electroconductive layer 26 can be located on the first surface 22 within the boundary 51 of the driving portion 50. In addition, at least one end 28 in the first direction 110 of the second electroconductive layer 26 can be located within the sides 22a of the first surface 22 within the driving portion 50.

Accordingly, the piezoelectric element 300 of the present embodiment can have the same features as in the first and the second embodiment. Thus, the reliability of the piezoelectric element 300 can be enhanced. The piezoelectric actuator 301 of the present embodiment includes the piezoelectric element 300. Hence the piezoelectric actuator 301 can have the same features as the piezoelectric element 300.

1.4 Fourth Embodiment

A piezoelectric element 400 and a piezoelectric actuator 401 according to a fourth embodiment will now be described with reference to the corresponding drawings. In the piezoelectric element 400 and the piezoelectric actuator 401 of the present embodiment, the piezoelectric layer of the piezoelectric element of any one of the first to third embodiments is modified. The same parts as in the first to third embodiments are designated by the same reference numerals and the same description will not be repeated.

Figure 4A:
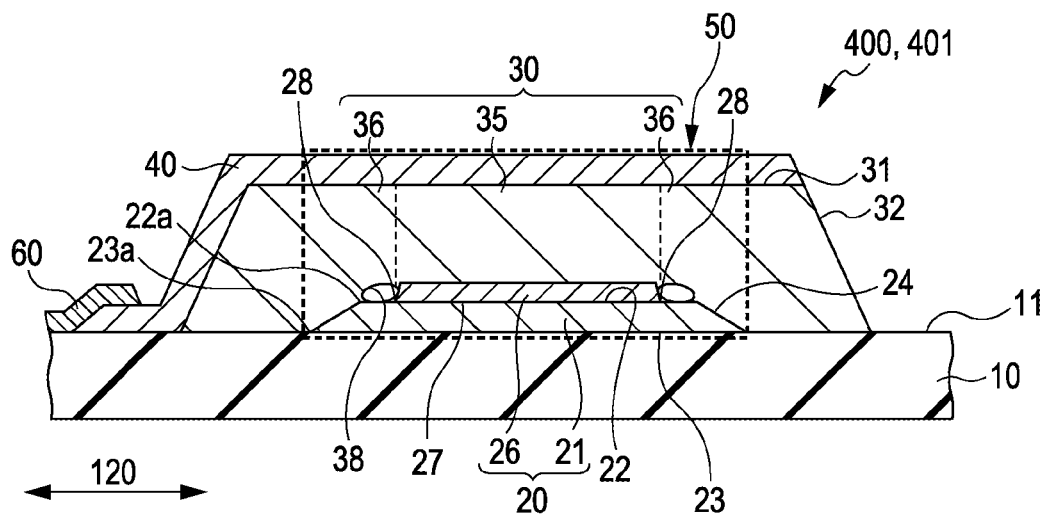
FIG. 4A is a schematic sectional view of a piezoelectric element according to an embodiment of the invention.
Figure 4B:
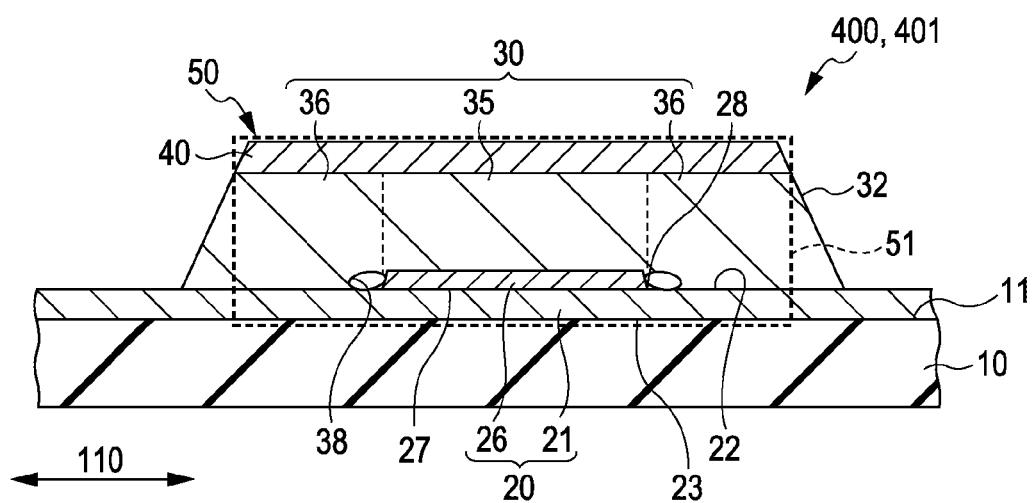
FIG. 4B is another schematic sectional view of the piezoelectric element shown in FIG. 4A.

In the piezoelectric element 400 of the present embodiment, the piezoelectric layer of the piezoelectric element of any one of the first to third embodiments is modified. The figures according to the present embodiment show a modification of the piezoelectric element 200 of the second embodiment as an example. FIGS. 4A and 4B are schematic sectional views of a piezoelectric element 400 according to a fourth embodiment. FIG. 4A is a sectional view similar to the sectional view of the piezoelectric element 200 of the second embodiment taken along line IVA-IVA in FIG. 2A, and FIG. 4B is a sectional view similar to the sectional view taken along line IIB-IIB in FIG. 2A.

As shown in FIGS. 4A and 4B, the piezoelectric layer 30 has a cavity 38 in a region adjacent to the ends 28 (at the sides) of the second electroconductive layer 26) over the first surface 22. The cavity 38 may be formed by a plurality of voids. In other words, the region where the cavity 38 is formed may have a lower density than the other region of the piezoelectric layer 30.

The cavity 38 in the piezoelectric layer 30 can be provided in any case where the ends 28 of the second electroconductive layer 26 lie within the driving portion 50. For example, the cavity 38 may be formed in the piezoelectric element 200 of the second embodiment, in regions adjacent to the ends 28 in the second direction 120 of the piezoelectric element 100 of the first embodiment, or in regions adjacent to the ends 28 in the first direction 110 and the second direction 120 of the piezoelectric element 300 of the third embodiment.

The piezoelectric element 400 of the present embodiment has a cavity 38 absorbing stress in the piezoelectric layer 30 in a region adjacent to the boundary of the driving portion 50. Consequently, the stress likely to concentrate at the boundary of the driving portion 50 during operation can further be alleviated. Thus, the reliability of the piezoelectric element 401 of the present embodiment can be further enhanced.

2. Method for Manufacturing Piezoelectric Element or Piezoelectric Actuator 2.1 Method for Manufacturing Piezoelectric Elements of the First to Third Embodiments A method for manufacturing the piezoelectric elements 100, 200 and 300 or the piezoelectric actuators 101, 201 and 301 according to the first to third embodiments of the invention will not be described with reference to the corresponding drawings. Although the first to third embodiments are different from each other in terms of where the first electrode 20 or the second electrode 40 is disposed, the method of the present embodiment can be applied to those embodiments by appropriately setting the patterning regions of these electrodes. In the present embodiment, a manufacturing method of the piezoelectric element 300 of the third embodiment will be described as an example.

FIGS. 5A to 6D are schematic sectional views showing a manufacturing method of a piezoelectric element according to the present embodiment. FIGS. 5A to 6D show the section taken along line IIIC-IIIC in FIG. 3A.

Figure 5A:
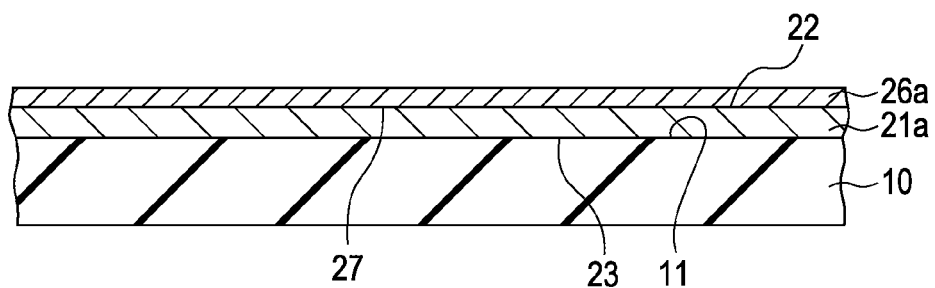
FIGS. 5A to 5C are schematic sectional views showing a method for manufacturing a piezoelectric element according to an embodiment of the invention.

As shown in FIG. 5A, a first electroconductive film 21a is formed on a substrate 10. The first electroconductive film 21a has a first surface 22, and a third surface 23 opposite the first surface 22. The first electroconductive film 21a is a material layer of the first electroconductive layer 21. The first electroconductive film 21a can be formed by a known method. For example, the first electroconductive film 21a may be formed by sputtering, plating, or vacuum vapor deposition.

If a vibration plate is used as the substrate 10, a piezoelectric actuator 101 can be produced. The vibration plate 10 has been described, and the same description will not be repeated.

Then, a second electroconductive film 26a having a second surface 27 at the first surface 22 side is formed on the first electroconductive film 21a, as shown in FIG. 5A. The second electroconductive film 26a is a material layer of the second electroconductive layer 26. The second electroconductive film 26a can be formed by a known method. For example, the second electroconductive film 26a may be formed by sputtering, plating, or metal organic deposition (MOD).

Figure 5B:
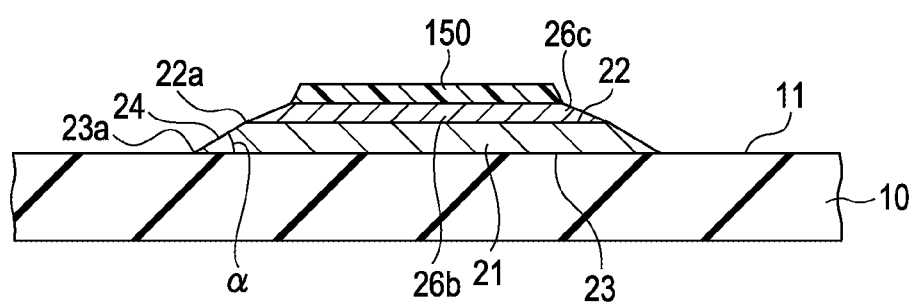

After a resist layer 150 is formed on the second electroconductive film 26a, the first electroconductive film 21a and the second electroconductive film 26a are patterned by a known method, as shown in FIG. 5B. Thus the resulting structure has a first electroconductive layer 21, the second electroconductive film 21a whose length is reduced on the first surface 22 in the direction perpendicular to the thickness direction, and the resist layer 150.

The patterning is performed by a known method, such as photolithography or etching. If a dry etching is applied, a high-density plasma, such as ICP (Inductively Coupled Plasma), may be used. Dry etching can be advantageously performed by using a high-density plasma etching apparatus at a pressure of 1.0 Pa or less.

For the etching, a mixture of chlorine gas and argon gas (hereinafter referred to as first mixed gas) may be used. Pt, Ir and LNO, which are contained in the first electroconductive film 21a or the second electroconductive film 26a, do not easily react with the first mixed gas. If the first mixed gas is used, the electroconductive films are etched by a sputtering effect of dry etching.

By controlling the rate of reduction of the resist layer 150 (etching rate of the first and second electroconductive films 21a and 26a in the direction perpendicular to the thickness direction), the angle α of the second corner 23a (inclination of the side surfaces 24 of the first electroconductive layer 21 with respect to the upper surface 11 of the substrate 10) and the shape of the second electroconductive film 26b can be controlled.

The higher the reduction rate of the resist layer 150, the smaller the angle α. The reduction rate of the resist layer 150 can be controlled by the flow rate ratio of the chlorine gas in the first mixed gas, or pressure. For example, the second corner 23a can be formed so as to have an angle α of 50° or less by setting the flow rate ratio of the chlorine gas in the mixed gas in the range of 60% to 80%, or setting the pressure in the range of 0.3 to 1.0 Pa. Alternatively, the resist layer 150 may be formed so as to lie down in advance. For forming such a resist layer 150, the focal point for exposure may be displaced.

The second electroconductive film 26b is controlled to a shape having side portions 26 as shown in FIG. 5B. The side portions 26c of the second electroconductive film 26b may be portions of the second electroconductive film 26b disposed on the first surface 22, not covered with the resist layer 150, as shown in FIG. 5B. When the resist layer 150 is reduced by etching, the first electroconductive film 21a and the second electroconductive film 26a are reduced following the reduction of the resist layer 150. However, the etching rate of LNO, which is the main constituent of the second electroconductive film 26a, is lower than that of the resist layer 150, and the reduction rate (etching rate) of the second electroconductive film 26a is reduced accordingly. Consequently, the resulting second electroconductive film 26b can have the side portions 26c as shown in FIG. 5B. In order to control the shape of the second electroconductive film 26b, the etching may be performed at a pressure of 0.6 Pa with the first mixed gas prepared by mixing chlorine and argon at a flow rate ratio of 3:2. The side portions 26c can be lengthened by increasing the reduction degree of the resist layer 150. As the difference in selectivity between the resist layer 150 and the first electroconductive layer 21 is reduced, the resist layer 150 is reduced more. Alternatively, the resist layer 150 may be formed so as to lie down in advance. Thus the resist layer 150 can be reduced more. The side portions 26c are removed in a subsequent operation.

Figure 5C:
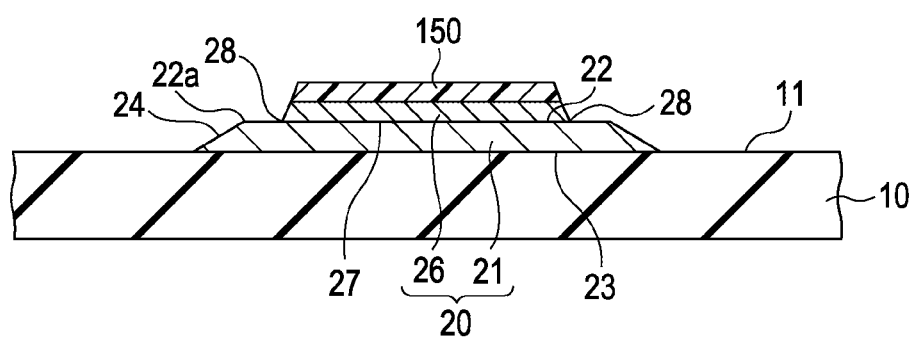

Then, the side portions 26c of the second electroconductive film 26b are removed, as shown in FIG. 5C. Thus the second electroconductive layer 26 is completed, and at least one end 28 of the second electroconductive layer 26 is located within the sides 22a of the first surface 22 of the first electroconductive layer 21. Hence, the second surface 27 of the second electroconductive layer 26 has a smaller area than the first surface 22.

The side portion 26c can be removed by any method without particular limitation, and a known etching technique may be applied. If the first mixed gas containing chlorine gas is used for patterning the first electroconductive layer 21, the side portions 26c may be removed by allowing the work to stand in the air containing water vapor for a predetermined time to bring the work into contact with the air, and then washing the work. In the use of the first mixed gas, chlorine remains on the surfaces of the resist layer 150 and the second electroconductive film 26b after the etching of the first electroconductive layer 21. The chlorine can react with the moisture in the air to produce hydrochloric acid, and consequently dissolve (corrode) the exposed side portions 26c of the second electroconductive film 26b. The dissolution of the side portions 26c can be stopped by washing the work, and thus the dissolved side portions 26c can be washed away to be removed. In this operation, the amount of chlorine remaining on the work is larger in the case where the work is allowed to stand in the air with the resist layer maintained without being removed. Accordingly, the side portions 26c of the second electroconductive film 26b can be more efficiently removed in such a case. The time for which the work is allowed to stand can be appropriately set according to the thickness of the second electroconductive film 26b or the shape of the side portions 26c. The above operation does not require special equipment or solvent for removing the side portions 26c. Thus, the manufacturing cost can be reduced, and the productivity can be increased.

Thus, the first electrode 20 including the first electroconductive layer 21 and the second electroconductive layer 26 can be formed. After the above operation, the resist layer 150 is removed as required. The first electrode 20 has been described in detail above, and the same description is not repeated.

Figure 6A:
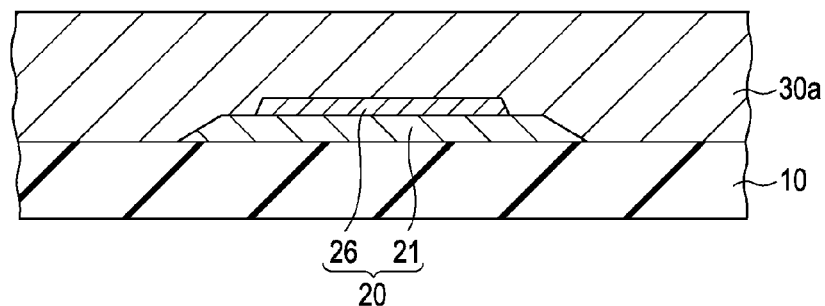
FIGS. 6A to 6D are schematic sectional views showing the method for manufacturing a piezoelectric element.

Turning to FIG. 6A, a first piezoelectric material film 30a for the piezoelectric layer 30 is formed over the first electrode 20. The first piezoelectric material film 30a can be formed by a known method, such as a sol-gel method, chemical vapor deposition (CVD), MOD, sputtering, or laser ablation.

The first piezoelectric material film 30a can be crystallized by heat treatment. Thus the first piezoelectric material film 30b can be formed. The crystallization of the first piezoelectric material film 30a may be partially performed, or may be performed after patterning the second electrode 40. The conditions of the heat treatment are not particularly limited as long as the first piezoelectric material film 30a can be crystallized. For example, the heat treatment can be performed in an oxygen atmosphere at a temperature of 500 to 800° C. In order to form first piezoelectric material film 30b having a predetermined thickness, operations for forming a precursor and for crystallizing the precursor may be repeated several times.

Figure 6B:
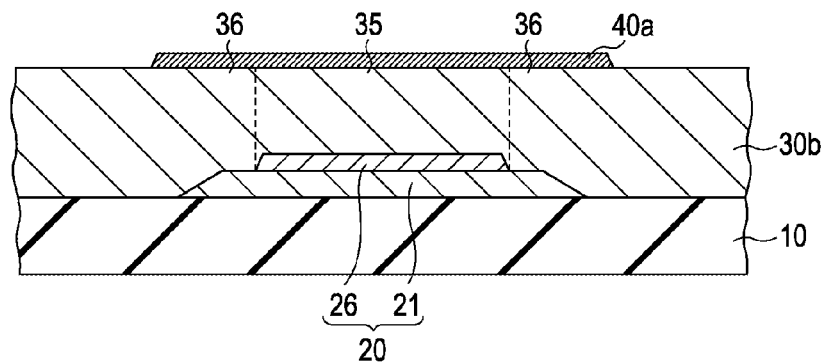

As shown in FIG. 6B, part of the first piezoelectric material film 30b is crystallized on the second electroconductive layer 26, and the other part is crystallized on the members other than the second electroconductive layer 26. Thus the first piezoelectric material film 30b has a first portion 35 and a second portion 36.

Then, the first piezoelectric material film 30b is patterned into a predetermined shape to form the piezoelectric layer 30. The pattering of the first piezoelectric material film 30b can be performed, for example, by known photolithography and etching. For example, the piezoelectric layer 30 having a desired shape may be formed using a resist layer (not shown).

Figure 6C:
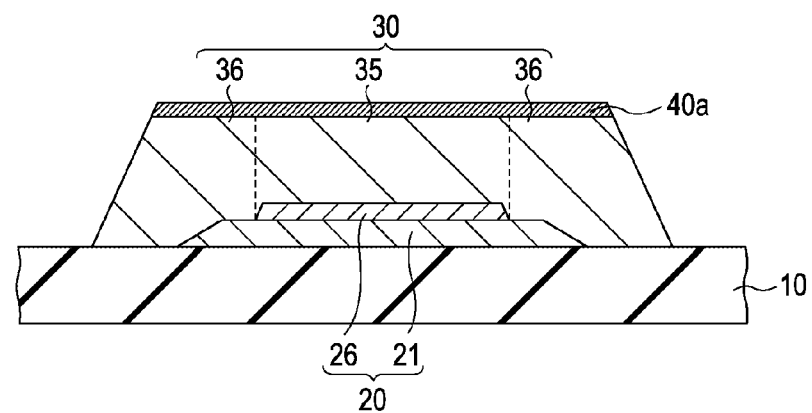

Alternatively, a mask layer 40a may be formed of the material of the second electrode 40 as an etching hard mask, as shown in FIG. 6B. After the formation of the mask layer 40a, the first piezoelectric material film 30b is patterned into a desired shape by etching, as shown in FIG. 6C. Since the mask layer 40a acts as a hard mask for etching, the resulting piezoelectric layer 30 has tapered side surfaces 32, as shown in FIG. 6C. The piezoelectric layer 30 has been described in detail above, and the same description is not repeated. The mask layer 40a is not necessarily required, and may be removed by etching using a resist layer (not shown).

Figure 6D:
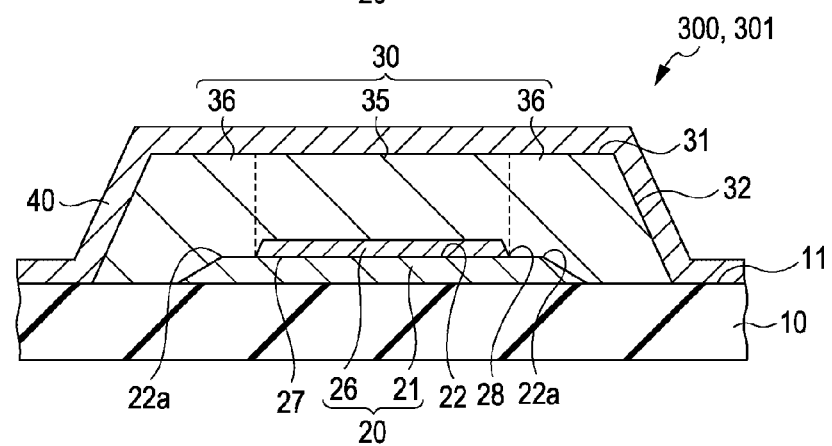

Turning to FIG. 6D, a third electroconductive film is formed over the piezoelectric layer 30, and is patterned to form the second electrode 40. The pattering of the third electroconductive film can be performed, for example, by known photolithography and etching. The patterning of the second electrode 40 is performed so that the second electrode 40 overlies at least part of the first electrode 20 when viewed in the direction of the normal to the first surface 22. The third electroconductive film 26a is a material layer of the second electrode 40. The third electroconductive film can be formed by a known method. For example, the third electroconductive film may be formed by sputtering, plating, or vacuum vapor deposition. Since the mask layer 40a is made of the same material as the third electroconductive film, it can be integrated with the third electroconductive film. The second electrode 40 is thus formed. The second electrode 40 has been described in detail above, and the same description is not repeated.

The piezoelectric element 300 or the piezoelectric actuator 301 can be manufactured through the above-described operations.

The manufacturing method of the present embodiment has the following features.

According to the method of the present embodiment for manufacturing a piezoelectric element or a piezoelectric actuator, the piezoelectric layer 30 has the first portion 35 that has been crystallized on the second electroconductive layer 26 mainly containing LNO and the second portion 36 that has been crystallized on surfaces other than the surface of the second electroconductive layer 26 (for example, on the upper surface of the first electroconductive layer 21 and the upper surface 11 of the substrate 10), as shown in FIG. 6D.

The first portion 35 is oriented in the (100) direction on the LNO layer by the crystallization. Consequently, the resulting piezoelectric layer can exhibit superior piezoelectricity. This is because the first portion inherits the crystallinity of the LNO oriented in the (100) direction. However, the components of LNO are diffused into the first portion 35, and accordingly, the resulting piezoelectric layer contains impurities, such as La and Ni, in the first portion 35.

The second portion 36 crystallized on surfaces other than the surface of the second electroconductive layer 26, such as the first electroconductive layer 21 and the upper surface 11 of the substrate 10, is also oriented preferentially in the (100) direction. However, since the second portion 36 also contains crystals oriented, for example, in the (111) direction, the piezoelectricity of the second portion 36 is inferior to those of the first portion 35. However, the components of LNO in the first electroconductive layer 21 are hardly diffused into the second portion 36. Consequently, the second portion 36 contains less impurity and, thus, has a higher withstand voltage than the first portion 35.

Since at least part of the boundary of the driving portion 50 is occupied by the second portion 36 having a higher withstand voltage and lower piezoelectricity than the first portion 35, stress on the boundary of the driving portion 50 can be reduced. Consequently, the piezoelectric layer 30 can be prevented from being broken during operation.

Thus, a highly reliable piezoelectric element and piezoelectric actuator can be provided.

2.2 Method for Manufacturing the Piezoelectric Element According to the Fourth Embodiment A method for manufacturing the piezoelectric element 400 or the piezoelectric actuator 401 according to the fourth embodiment will now be described with reference to the corresponding drawings.

As described above, the features of the fourth embodiment can be applied to any of the piezoelectric elements according to the first to third embodiments. In the following description of the method of the present embodiment, an exemplary case will be described where the features of piezoelectric element 400 of the fourth embodiment are applied to the piezoelectric element 300 of the third embodiment.

FIGS. 7A to 7D schematically show a method for manufacturing the piezoelectric element 400 or the piezoelectric actuator 401 according to the fourth embodiment. FIGS. 7A to 7D are sectional views corresponding to the sectional view of the piezoelectric element 300 of the third embodiment taken along line IIIC-IIIC in FIG. 3A.

Figure 7A:
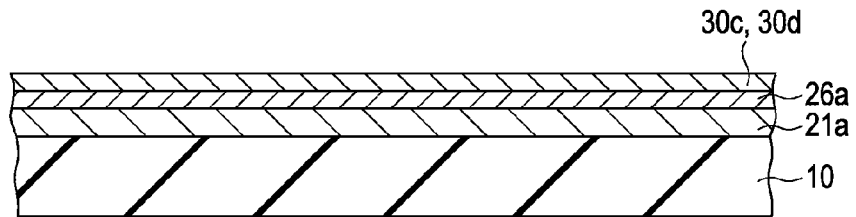
FIGS. 7A to 7D are schematic sectional views showing a method for manufacturing a piezoelectric element according to an embodiment of the invention.

As shown in FIG. 7A, a first electroconductive film 21a and a second electroconductive film 26a are formed on a substrate 10, as in the method described in 2.1 above. In the method of the present embodiment, a second piezoelectric material film 30c is further formed over the second electroconductive film 26a. The second piezoelectric material film 30c can be made of the same material as the first piezoelectric material film 30a. The second piezoelectric material film 30c can be formed by the same process as the first piezoelectric material film 30a.

The second piezoelectric material film 30c may be subjected to heat treatment to form a crystallized second piezoelectric material film 30d. The crystallization of the second piezoelectric material film 30c may be partially performed, or may be performed simultaneously with the heat treatment of the first piezoelectric material film 30a. The heat treatment conditions may be the same as those of the first piezoelectric material film 30a.

Figure 7B:
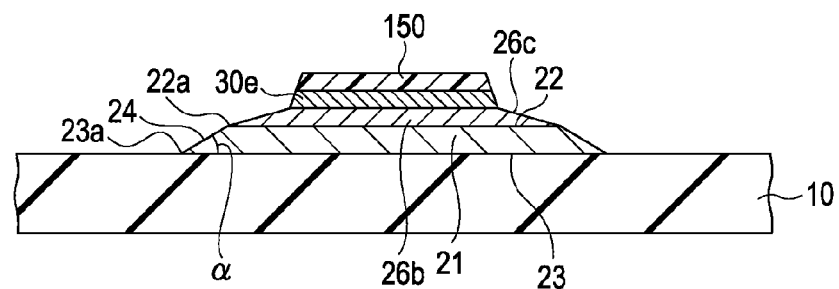

Then, a resist layer 150 is formed on the second piezoelectric material film 30d by a known method, and the first electroconductive film 21a, the second electroconductive film 26a and the second piezoelectric material film 30d are patterned. Thus a structure is formed which includes a first electroconductive layer 21 having a first surface 22, and the second electroconductive film 26b whose upper portion is reduced by etching and a second piezoelectric layer 30e over the first surface 22, as shown in FIG. 7B.

The patterning is performed by a known method, such as photolithography or etching. If etching is performed for patterning, a dry etching using a high-density plasma, such as ICP, may be applied. Dry etching can be advantageously performed by using a high-density plasma etching apparatus at a pressure of 1.0 Pa or less.

For etching the second piezoelectric material layer 30d, a mixture of chlorine gas and a chlorofluorocarbon gas (hereinafter referred to as second mixed gas) may be used. By using the second mixed gas, the second piezoelectric material film 30d, which may be made of PZT, can be etched at a high rate of 200 nm/min or more, and the resist selectivity can be as high as about 1.0.

The first electroconductive film 21a and the second electroconductive film 26a can be etched with the first mixed gas, as in the above description.

By controlling the rate of reduction of the resist layer 150, the angle α of the second corner 23a and the shape of the second electroconductive film 26b can be controlled.

The higher the reduction rate of the resist layer 150, the smaller the angle α. The reduction rate of the resist layer 150 can be controlled by the flow rate ratio of the chlorine gas in the first mixed gas, or pressure. For example, the second corner 23a can be formed so as to have an angle α of 50° or less by setting the flow rate ratio of the chlorine gas in the mixed gas in the range of 60% to 80%, or setting the pressure in the range of 0.3 to 1.0 Pa. Alternatively, the resist layer 150 may be formed so as to lie down. For forming such a resist layer 150, the focal point for exposure may be displaced.

The second electroconductive film 26b is controlled to a shape having side portions 26c as shown in FIG. 7B. The side portions 26c of the second electroconductive film 26b may be portions of the second electroconductive film 26b disposed on the first surface 22, not covered with the resist layer 150 or the second piezoelectric layer 30e, as shown in FIG. 7B. When the resist layer 150 is reduced by etching, the first electroconductive film 21a and the second electroconductive film 26a are etched following the reduction of the resist layer 150. However, the etching rate of LNO, which is the main constituent of the second electroconductive film 26a, is lower than that of the second piezoelectric material film 30d, and the etching rate of the second electroconductive film 26a is lower accordingly. Consequently, the resulting second electroconductive film 26b can have the side portions 26c. In order to control the shape of the second electroconductive film 26b, the etching may be performed at a pressure of 0.6 Pa with the first mixed gas prepared by mixing chlorine and argon at a flow rate ratio of 3:2.

Figure 7C:
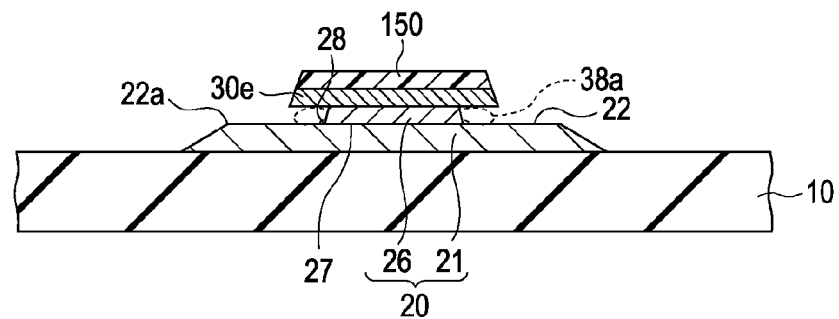

After the etching, the side portions 26c of the second electroconductive film 26b are removed, as shown in FIG. 7C. In the present embodiment, the portion of the second electroconductive film 26b covered with the second piezoelectric layer 30e is partially removed by side etching (over-etching), as well as the side portions 26c of the second electroconductive film 26b protruding from the second piezoelectric layer 30e.

Thus the second electroconductive layer 26 having the second surface 27 is completed, and at least one end 28 of the second electroconductive layer 26 is located within the sides 22a of the first surface 22 of the first electroconductive layer 21. Hence, the second surface 27 of the second electroconductive layer 26 has a smaller area than the first surface 22.

Also, as shown in FIG. 7C, a vacant region 38a is formed in a region adjacent to the ends of the second electroconductive layer 26 over the first surface. The second electroconductive layer 26 is not formed in the vacant region 38a, and this region lies at the sides of the second electroconductive layer 26 between the first electroconductive layer 21 and the second piezoelectric layer 30e. After the piezoelectric layer 30 is formed, the vacant region 38a acts as the cavity 38.

The operation removing the side portions 26c to form the vacant region 38a can be performed by any method without particular limitation, and a known etching technique may be applied. For this etching, hydrofluoric acid or hydrochloric acid may be used. If the first mixed gas containing chlorine gas is used for patterning the first electroconductive layer 21, the side portions 26c may be removed to form the vacant region 38a by allowing the work to stand in the air containing water vapor for a predetermined time to bring the work into contact with the air, and then washing the work. In the use of the first mixed gas, chlorine remains on the surfaces of the resist layer 150, the second piezoelectric material film 30e and the second electroconductive film 26b after the etching of the first electroconductive layer 21. The chlorine can react with the moisture in the air to produce hydrochloric acid, and consequently dissolve (corrode) the exposed side portions 26c of the second electroconductive film 26b. The dissolution of the side portions 26c can be stopped by washing the work, and thus the dissolved side portions 26c can be washed away to be removed. The vacant region 38a may be formed by over-etching the second electroconductive film 26b. In this operation, the amount of chlorine remaining on the work is larger in the case where the work is allowed to stand in the air with the resist layer maintained without being removed. Accordingly, the side portions 26c of the second electroconductive film 26b can be more efficiently removed in such a case. The time for which the work is allowed to stand can be appropriately set according to the thickness of the second electroconductive film 26b or the shape of the side portions 26c. The above operation does not require special equipment or solvent for removing the side portions 26c. Thus, the manufacturing cost can be reduced, and the productivity can be increased.

Thus, the first electrode 20 including the first electroconductive layer 21 and the second electroconductive layer 26 can be formed through the above-described operation. After the above operation, the resist layer 150 is removed. The first electrode 20 has been described in detail above, and the same description is not repeated.

Figure 7D:
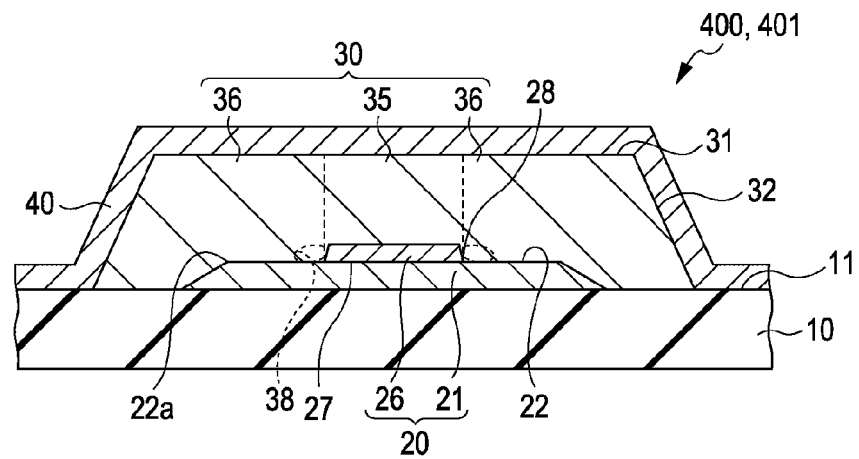

Then, a piezoelectric layer 30 and a second electrode 40 are formed over the second piezoelectric layer 30e and the first electrode 20, as shown in FIG. 7D. Since the second piezoelectric layer 30e is made of the same piezoelectric material as the piezoelectric layer 30, it can be integrated with the piezoelectric layer 30. The piezoelectric layer 30 and the second electrode 40 are formed by the same process as in the foregoing operation shown in FIGS. 6A to 6D, and the same description is not repeated.

The piezoelectric element 400 or the piezoelectric actuator 401 can be manufactured through the above-described operations.

The method of the present embodiment provides a piezoelectric element or piezoelectric actuator having a cavity 38 absorbing stress in the piezoelectric layer 30 in a region adjacent to the boundary of the driving portion 50. Consequently, the stress likely to concentrate at the boundary of the driving portion 50 during operation can further be alleviated. Thus, a more highly reliable piezoelectric element and piezoelectric actuator can be provided.

3. Liquid Ejecting Head

Figure 8:
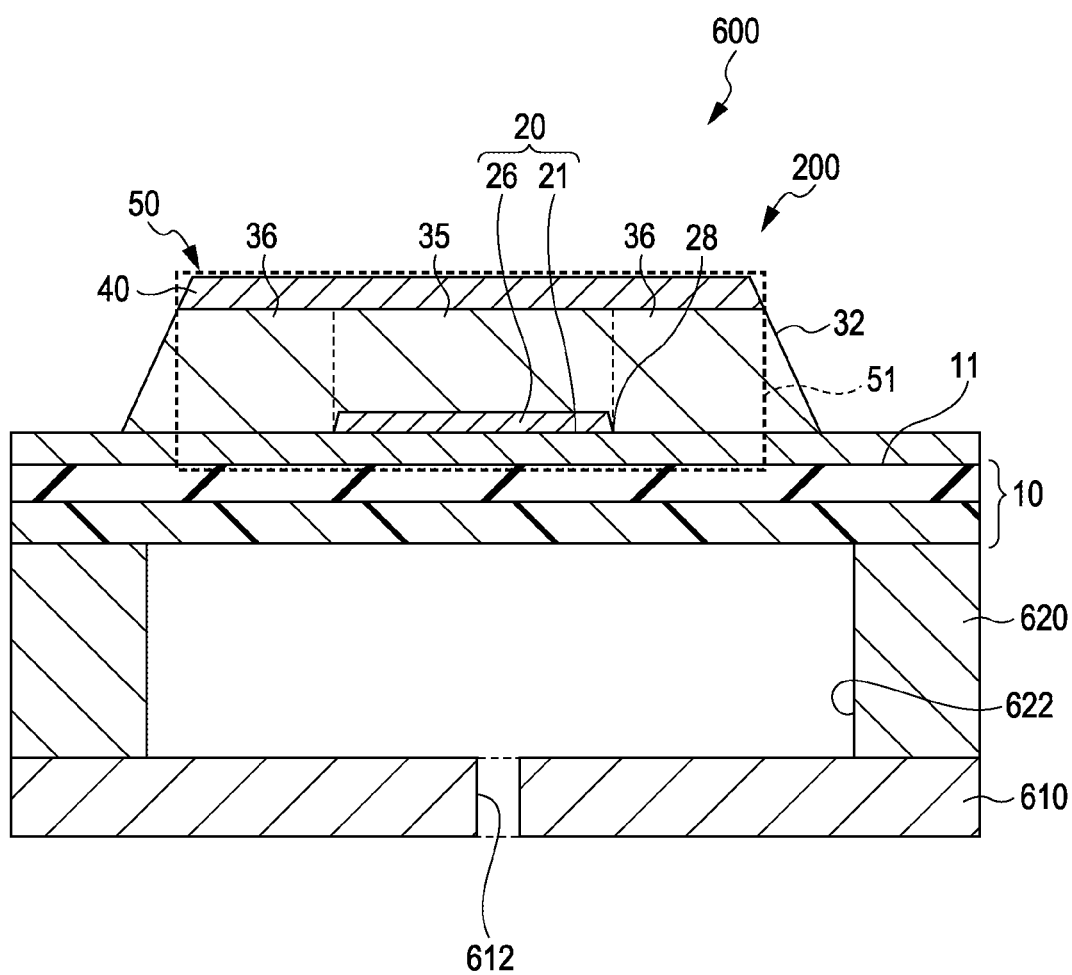
FIG. 8 is a schematic sectional view of a liquid ejecting head according to an embodiment of the invention.
Figure 9:
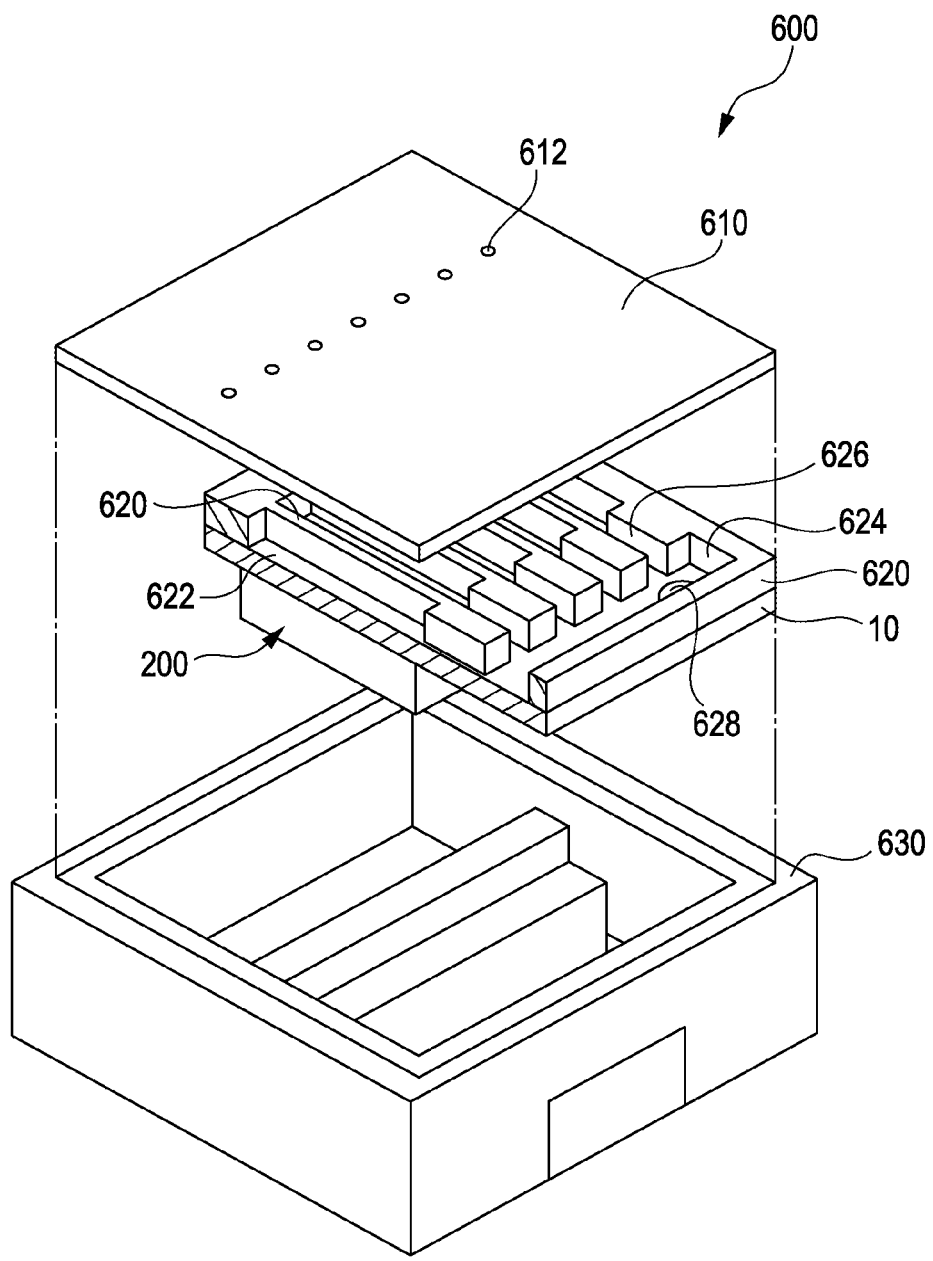
FIG. 9 is an exploded perspective view of the liquid ejecting head shown in FIG. 8.

A liquid ejecting head 600 will now be describe which includes a piezoelectric actuator including a piezoelectric element according to an embodiment of the invention, with reference to the corresponding drawings. FIG. 8 is a schematic sectional view of the liquid ejecting head 600 according to the present embodiment. FIG. 9 is an exploded perspective view of the liquid ejecting head 600, showing a state where the head is reversed from the normal position.

The liquid ejecting head 600 may include the piezoelectric element (piezoelectric actuator) of an embodiment of the invention. In the liquid ejecting head 600 of the present embodiment, the substrate 10 is a vibration plate 10, and the piezoelectric element 200 acts as a piezoelectric actuator.

The liquid ejecting head 600 includes a nozzle plate 610 having nozzle apertures 612, a pressure chamber substrate 620 having a pressure chamber 622 therein, and a piezoelectric element 200, as shown in FIGS. 8 and 9.

The number of piezoelectric elements 200 is not particularly limited, and may be plural. When a plurality of piezoelectric elements 200 are used, the first electrode 20 functions as a common electrode. In addition, the liquid ejecting head 600 may include an enclosure 630, as shown in FIG. 9. In FIG. 9, the piezoelectric element 200 is simplified.

The nozzle plate 610 has nozzle apertures 612, as shown in FIGS. 8 and 9. Liquids, such as ink, and other fluids can be ejected through the nozzle apertures 612, including functional materials whose viscosity has been adjusted with a solvent or disperse medium and liquids containing metal flakes. The nozzle apertures 612 may be aligned in a line. The nozzle plate 610 may be made of silicon or stainless steel (SUS).

The pressure chamber substrate 620 is disposed on the nozzle plate 610 (under the nozzle plate in FIG. 9). The pressure chamber plate 620 may be made of, for example, silicon. The pressure chamber substrate 620 divides a space between the nozzle plate 610 and the vibration plate 10 so as to form a reservoir (liquid storage portion) 624, delivering paths 626 communicating with the reservoir 624, and pressure chambers 622 communicating with the respective delivering paths 626, as shown in FIG. 9. In the present embodiment, the reservoir 624, the delivering paths 626 and the pressure chambers 622 are described separately. However, they constitute a flow channel, and the flow channel can be arbitrarily designed without particular limitation. The delivering paths 626 shown in FIG. 4 each partially narrowed, but can be formed into any shape according to the design without being limited to such a shape. The reservoir 624, the delivering paths 626 and the pressure chambers 622 are partitioned by the nozzle plate 610, the pressure chamber substrate 620 and the vibration plate 10. The reservoir 624 can temporally store ink supplied from the outside (for example, an ink cartridge) through a through hole 628 formed in the vibration plate 10. The ink in the reservoir 624 is delivered to the pressure chambers 622 through the delivering paths 626. The capacity of the pressure chamber 622 is varied by the deformation of the vibration plate 10. The pressure chamber 622 communicates with the nozzle aperture 612. By varying the capacity of the pressure chamber 622, the liquid is ejected through the nozzle aperture 612.

The piezoelectric element 200 is disposed over the pressure chamber substrate 620 (under the pressure chamber substrate in FIG. 9). The piezoelectric element 200 is electrically connected to a piezoelectric element driving circuit (not shown) so as to be operated according to the signal from the piezoelectric element driving circuit. The vibration plate 10 is deformed by the behavior of the piezoelectric layer to vary the pressure in the pressure chamber 622 as required.

The enclosure 630 accommodates the nozzle plate 610, the pressure chamber substrate 620 and the piezoelectric element 50, as shown in FIG. 9. The enclosure 630 can be made of, for example, a resin or a metal.

The liquid ejecting head 600 includes the above-described highly reliable piezoelectric element (piezoelectric actuator). Accordingly, the liquid ejecting head is also highly reliable.

The liquid ejecting head 600 of the present embodiment may be an ink jet recording head. Also, the liquid ejecting head may be a color material ejecting head used for manufacturing color filters of, for example, a liquid crystal display, an electrode material ejecting head used for forming electrodes of an organic EL display or a field emission display (FED), or a bioorganic material ejecting head used for manufacturing bio-chips.

4. Liquid Ejecting Apparatus

Figure 10:
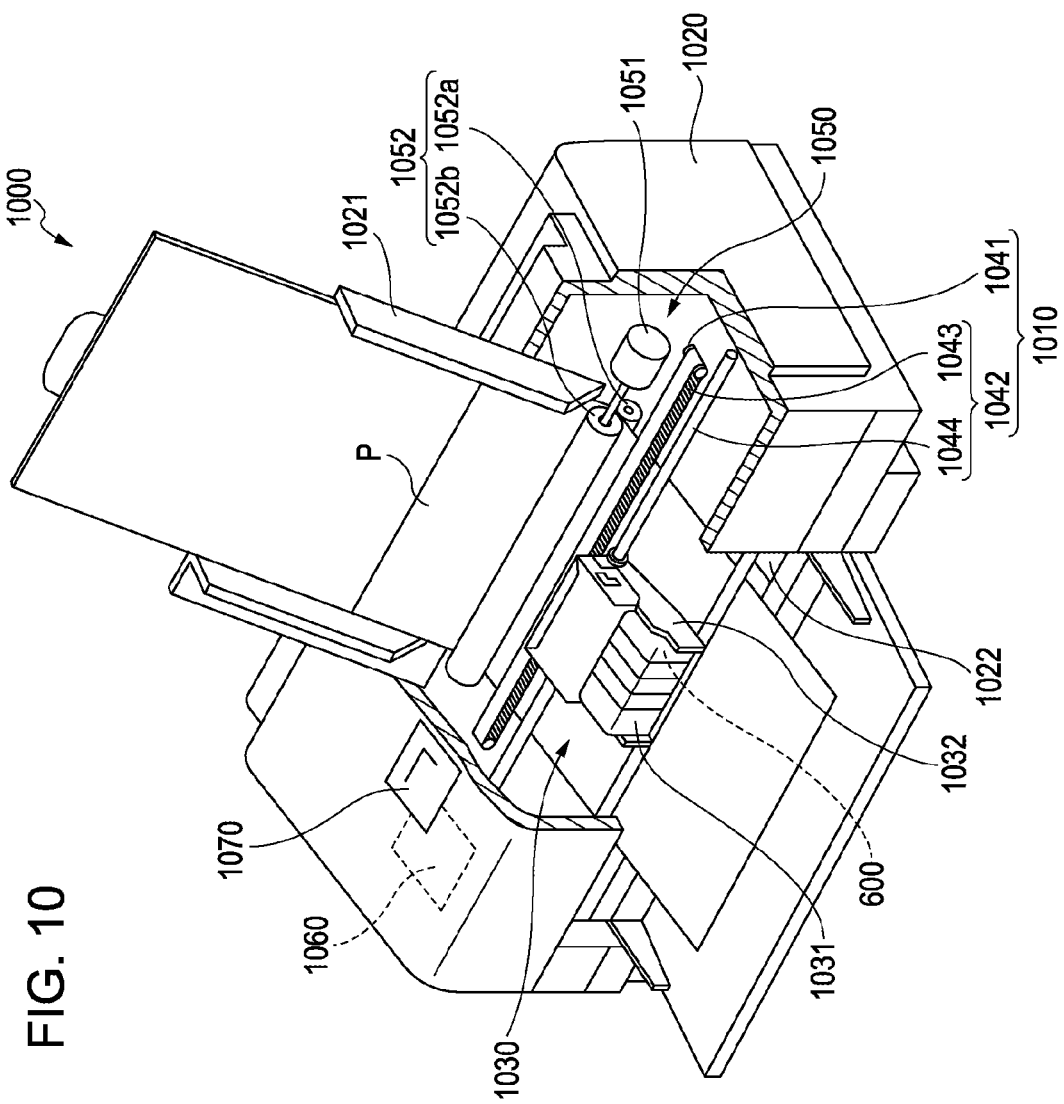
FIG. 10 is a schematic perspective view of a liquid ejecting apparatus according to an embodiment of the invention.

A liquid ejecting apparatus according to an embodiment of the invention will now be described. The liquid ejecting apparatus includes the liquid ejecting head according to an embodiment of the invention. In the present embodiment, a liquid ejecting apparatus 1000 acting as an ink jet printer will be described. FIG. 10 is a schematic perspective view of the liquid ejecting apparatus 1000.

The liquid ejecting apparatus 1000 includes a head unit 1030, a driving section 1010, and a control section 1060. The liquid ejecting apparatus 1000 further includes a apparatus body 1020, a paper feeding section 1050, a tray 1021 on which recording paper P is placed, a paper ejecting port 1022 from which the recording paper P is ejected, and a control panel 1070 disposed on the upper surface of the apparatus body 1020.

The head unit 1030 includes an ink jet recording head (hereinafter may be simply referred to as the head) including the liquid ejecting head 600. The head unit 1030 further includes an ink cartridge 1031 delivering an ink to the head and a carrying portion (carriage) 1032 on which the head and the ink cartridge 1031 are disposed.

The driving section 1010 reciprocally moves the head unit 1030. The driving section 1010 includes a carriage motor 1041 being a driving source of the head unit 1030, and a reciprocal movement mechanism 1042 allowing the rotation of the carriage motor 1041 to reciprocally move the head unit 1030.

The reciprocal movement mechanism 1042 includes a carriage guide shaft 1044 whose ends are held by a frame (not shown), and a timing belt 1043 extending in parallel with the carriage guide shaft 1044. The carriage guide shaft 1044 supports the carriage 1032 so as to allow the reciprocal movement of the carriage 1032. The carriage 1032 is secured to part of the timing belt 1043. When the timing belt 1043 is moved by the operation of the carriage motor 1041, the head unit 1030 reciprocally moves along the carriage guide shaft 1044. The head ejects ink during the reciprocal movement to print on the recording paper P.

The control section 1060 can control the head unit 1030, the driving section 1010 and the paper feeding section 1050.

The paper feeding section 1050 feeds recording paper P toward the head unit 1030 from the tray 1021. The paper feeding section 1050 includes a paper feeding motor 1051 being a driving source, and a paper feeding roller 1052 rotated by the operation of the paper feeding motor 1051. The paper feeding roller 1052 includes a driven roller 1052a and a driving roller 1052b vertically opposing each other with the recording paper P therebetween. The driving roller 1052b is coupled with the paper feeding motor 1051. When the paper feeding section 1050 is driven by the control section 1060, the recording paper P is transported under the head unit 1030.

The head unit 1030, the driving section 1010, the control section 1060 and the paper feeding section 1050 are disposed within the apparatus body 1020.

The liquid ejecting apparatus 1000 includes the liquid ejecting head according to an embodiment of the invention, such as the above-described liquid ejecting head 600. The liquid ejecting head according to the embodiments of the invention includes a highly reliable piezoelectric element. Accordingly, the liquid ejecting apparatus 1000 can be highly reliable.

Although an ink jet printer has been described as the liquid ejecting apparatus 1000 in the present embodiment, the liquid ejecting apparatus of an embodiment of the invention may be applied to an industrial use. In this instance, the liquid ejected from the apparatus may be a functional material whose viscosity has been adjusted with a solvent or disperse medium, or a liquid containing metal flakes or the like.

While the invention has been described with reference to exemplary embodiments, it is to be understood that various modifications may be made without departing from the new features and effects of the invention. Such modifications are within the scope of the invention.

What is claimed is:

1. A piezoelectric element comprising:
   a first electrode including:
      a first electroconductive layer having a first surface; and
      a second electroconductive layer mainly containing lanthanum nickelate disposed on the first surface, the second electroconductive layer having a second surface at the first surface side;
   a second electrode; and
   a piezoelectric layer disposed between the first electrode and the second electrode with the second electroconductive layer closer to the piezoelectric layer than the first electroconductive layer, the piezoelectric layer having first sides in a first direction and second sides in a second direction,
   wherein the first electrode, the piezoelectric layer and the second electrode overlap with each other when viewed in a direction normal to the first surface to form an overlap portion acting as a driving portion, and
   wherein at least part of the second electroconductive layer is disposed within the sides of the first surface within the driving portion
   wherein boundaries of the driving portion are determined by an end of the second electrode in the second direction and an end of the first electroconductive layer in the second direction,
   wherein the second electrode is disposed on a portion of the first sides of the piezoelectric layer and on one of the second sides of the piezoelectric layer in the second direction that intersects the first direction, and
   the second surface has a smaller area than the first surface within the driving portion.

2. The piezoelectric element according to claim 1, wherein the piezoelectric layer has a first portion lying between the second electroconductive layer and the second electrode and a second portion other than the first portion, and wherein the first portion is more highly oriented in the (100) direction than the second portion.

3. The piezoelectric element according to claim 1, wherein the piezoelectric layer has a cavity therein over the first surface in a region adjacent to an end of the second electroconductive layer.

4. The piezoelectric element according to claim 1, wherein the first electroconductive layer has a third surface opposite the first surface and a fourth surface connecting between the first surface and the third surface, and the third surface and the fourth surface form an angle of 50° or less.

5. A piezoelectric actuator comprising:
   a vibration plate; and
   the piezoelectric element as set forth in claim 1, the piezoelectric element disposed on the vibration plate.

6. A liquid ejecting head comprising: the piezoelectric actuator as set forth in claim 5.

7. A liquid ejecting apparatus comprising: the liquid ejecting head as set forth in claim 6.

8. A piezoelectric actuator comprising:
a vibration plate; and
a plurality of piezoelectric elements as set forth in claim 1, arranged on the vibration plate in a first direction,
wherein the first electrode extends in the first direction so as to function as a common electrode of the plurality of piezoelectric elements, the piezoelectric layer extends in a second direction intersecting the first direction on the first electrode, and the second electrode extends in the second direction on the piezoelectric layer and overlies at least part of the first electrode, and wherein the second electroconductive layer has ends in the second direction at least one of which lies within the sides of the first surface within the driving portion.

9. The piezoelectric actuator according to claim 8, wherein the second electroconductive layer has ends in the first direction at least one of which lies on the first surface within the boundary of the driving portion.

10. A piezoelectric actuator comprising:
a vibration plate; and
a plurality of piezoelectric elements as set forth in claim 1, arranged on the vibration plate in the first direction,
wherein the first electrode extends in the second direction intersecting the first direction, the piezoelectric layer extends in the second direction and covers the first electrode, and the second electrode overlies at least part of the first electrode and spreads so as to act as a common electrode of the plurality of the piezoelectric elements, and wherein the second electroconductive layer has ends in the second direction, wherein a first end lies within the sides of the first surface within the driving portion.

11. The piezoelectric actuator according to claim 10, wherein the second electroconductive layer has ends in the first direction at least one of which lies within the sides of the first surface within the driving portion.

* * * * *